United States Patent
Shibata et al.

(10) Patent No.: US 7,923,130 B2
(45) Date of Patent: Apr. 12, 2011

(54) SURFACE-COATED CUTTING TOOL

(75) Inventors: Akihiko Shibata, Itami (JP); Haruyo Fukui, Itami (JP); Shinya Imamura, Itami (JP); Akira Kobayashi, Mie (JP)

(73) Assignee: Sumitomo Electric Hardmetal Corp., Hyogo (JP)

( * ) Notice: Subject to any disclaimer, the term of this patent is extended or adjusted under 35 U.S.C. 154(b) by 0 days.

(21) Appl. No.: 12/599,756

(22) PCT Filed: May 23, 2008

(86) PCT No.: PCT/JP2008/059517
§ 371 (c)(1),
(2), (4) Date: Nov. 11, 2009

(87) PCT Pub. No.: WO2008/146727
PCT Pub. Date: Dec. 4, 2008

(65) Prior Publication Data
US 2010/0215951 A1    Aug. 26, 2010

(30) Foreign Application Priority Data
May 30, 2007   (JP) .................................. 2007-143454

(51) Int. Cl.
*B32B 9/00*   (2006.01)
*B23B 27/14*  (2006.01)
(52) U.S. Cl. ........ 428/697; 428/216; 428/336; 428/472; 428/698; 428/699; 428/704; 51/307; 51/309
(58) Field of Classification Search .................... 51/307, 51/309; 428/216, 336, 472, 697, 698, 699, 428/701, 702, 704
See application file for complete search history.

(56) References Cited

U.S. PATENT DOCUMENTS

| | | | |
|---|---|---|---|
| 4,643,951 A | * | 2/1987 | Keem et al. .................... 428/472 |
| 4,753,854 A | * | 6/1988 | Gavrilov et al. .............. 428/699 |
| 5,503,912 A | * | 4/1996 | Setoyama et al. ............ 428/216 |

(Continued)

FOREIGN PATENT DOCUMENTS

EP    1 382 709    *   1/2004

(Continued)

OTHER PUBLICATIONS

Supplementary European Search Report issued in European Patent Application No. EP 08 76 4563, dated Apr. 29, 2010.

*Primary Examiner* — Archene Turner
(74) *Attorney, Agent, or Firm* — McDermott Will & Emery LLP (57) ABSTRACT

A surface-coated cutting tool according to the present invention including a substrate and a coating film formed on the substrate is characterized in that the coating film includes a composite super multi-layer film obtained by alternately stacking one or more first super multi-layer film and one or more second super multi-layer film, the first super multi-layer film above is formed by alternately stacking one or more A1 layer and one or more B layer, the second super multi-layer film above is formed by alternately stacking one or more A2 layer and one or more C layer, each of the A1 layer above and the A2 layer above is composed of any of TiN, TiCN, TiAlN, and TiAlCN, the B layer above is composed of TiSiN or TiSiCN, and the C layer above is composed of AlCrN or AlCrCN.

11 Claims, 1 Drawing Sheet

U.S. PATENT DOCUMENTS

| | | | |
|---|---|---|---|
| 6,077,596 A | 6/2000 | Hashimoto et al. | |
| 6,586,122 B2 * | 7/2003 | Ishikawa et al. | 428/698 |
| 7,060,345 B2 * | 6/2006 | Fukui et al. | 428/336 |
| 7,226,670 B2 * | 6/2007 | Derflinger et al. | 51/309 |
| 7,348,074 B2 * | 3/2008 | Derflinger | 51/307 |
| 7,527,457 B2 * | 5/2009 | Moriguchi et al. | 428/699 |
| 7,537,822 B2 * | 5/2009 | Ishikawa | 428/697 |
| 2004/0018393 A1 | 1/2004 | Fukui et al. | |
| 2005/0003239 A1 | 1/2005 | Derflinger et al. | |
| 2006/0222893 A1 | 10/2006 | Derflinger | |
| 2007/0269610 A1 | 11/2007 | Fukui et al. | |
| 2008/0131726 A1 | 6/2008 | Derflinger | |
| 2008/0131727 A1 | 6/2008 | Derflinger et al. | |
| 2010/0012483 A1 | 1/2010 | Derflinger | |

FOREIGN PATENT DOCUMENTS

| | | | |
|---|---|---|---|
| EP | 1 726 390 A1 | | 11/2006 |
| EP | 1 842 610 A1 | | 10/2007 |
| JP | 8-323506 | | 12/1996 |
| JP | 11-12718 | | 1/1999 |
| JP | 2000-326108 | * | 11/2000 |
| JP | 2000-334606 | | 12/2000 |
| JP | 2004-42192 | | 2/2004 |
| JP | 2005-262388 | * | 9/2005 |
| JP | 2006-137982 | | 6/2006 |
| JP | 2006-524748 | | 11/2006 |
| WO | WO 2004/059030 A2 | | 7/2004 |
| WO | WO 2006/070509 A1 | | 7/2006 |
| WO | WO 2006/102780 A1 | | 10/2006 |

* cited by examiner

FIG.1

SURFACE-COATED CUTTING TOOL

RELATED APPLICATIONS

This application is the U.S. National Phase under 35 U.S.C. §371 of International Application No. PCT/JP2008/059517, filed on May 23, 2008, which in turn claims the benefit of Japanese Application No. 2007-143454, filed on May 30, 2007, the disclosures of which Applications are incorporated by reference herein.

TECHNICAL FIELD

The present invention relates to a surface-coated cutting tool used for a cutting process or the like of a metal material.

BACKGROUND ART

In recent years, higher efficiency in a cutting process of a metal material has increasingly been demanded and a higher cutting speed has been required. Therefore, improvement in heat resistance (oxidation resistance) or wear resistance has been demanded in a coating film covering a surface of a substrate of a cutting tool.

Accordingly, in order to meet such demands, development of a coating film has been conducted in various manners. For example, use of a compound having a specific composition containing Al and Cr (what is called an AlCr-based coating film) has been proposed for such a coating film (Japanese Patent National Publication No. 2006-524748 (Patent Document 1)). According to this proposal, heat resistance or wear resistance can be improved to some extent, however, brittleness, which is a problem specific to such an AlCr-based coating film, is exhibited, which gives rise to a problem of fracture and peel-off of the coating film itself due to impact or the like during cutting.

On the other hand, an attempt to improve heat resistance or wear resistance by using a compound having a specific composition containing Ti and Si for a coating film (what is called a TiSi-based coating film) has conventionally been made. Such a TiSi-based coating film again exhibits brittleness as in the AlCr-based coating film above, which leads to a problem of fracture or peel-off of the coating film itself. In order to solve such a problem, it has been proposed to alternately stacking a coating film composed of a compound having a specific composition containing Ti and Al (TiAl-based coating film) and such a TiSi-based coating film (Japanese Patent Laying-Open No. 2000-334606 (Patent Document 2)). Such a proposal, however, was not able to sufficiently prevent fracture or peel-off of the coating film itself under severe cutting conditions in some cases.

In contrast, improvement in brittleness by alternately stacking a plurality of layers having a specific composition containing Al and Si has been proposed (Japanese Patent Laying-Open No. 2006-137982 (Patent Document 3)). The layer containing Al and/or Si intrinsically tends to exhibit brittleness and the problem of fracture or peel-off of the coating film has not yet sufficiently been solved.

Patent Document 1: Japanese Patent National Publication No. 2006-524748

Patent Document 2: Japanese Patent Laying-Open No. 2000-334606

Patent Document 3: Japanese Patent Laying-Open No. 2006-137982

DISCLOSURE OF THE INVENTION

Problems to be Solved by the Invention

The present invention was made in view of the present circumstances as above and an object of the present invention is to provide a surface-coated cutting tool having a coating film less likely to suffer brittleness while maintaining heat resistance and wear resistance.

Means for Solving the Problems

A surface-coated cutting tool according to the present invention including a substrate and a coating film formed on the substrate is characterized in that the coating film includes a composite super multi-layer film obtained by alternately stacking one or more first super multi-layer film and one or more second super multi-layer film, the first super multi-layer film above is formed by alternately stacking one or more A1 layer and one or more B layer, the second super multi-layer film above is formed by alternately stacking one or more A2 layer and one or more C layer, each of the A1 layer above and the A2 layer above is composed of any of TiN, TiCN, TiAlN, and TiAlCN, the B layer above is composed of TiSiN or TiSiCN, and the C layer above is composed of AlCrN or AlCrCN.

Here, the A1 layer above and the A2 layer above are preferably identical in composition, and preferably, each of the first super multi-layer film above and the second super multi-layer film above has a thickness not smaller than 0.1 μm and not greater than 0.5 μm and a ratio of thickness Y/X is not smaller than 0.5 and not greater than 4 where a thickness of the first super multi-layer film above is denoted by X and a thickness of the second super multi-layer film above is denoted by Y.

In addition, preferably, each of the A1 layer above, the A2 layer above, the B layer above, and the C layer above has a thickness not greater than 40 nm, a ratio of thickness Xb/Xa is not smaller than 0.2 and not greater than 3 where a thickness of the A1 layer above is denoted by Xa and a thickness of the B layer above is denoted by Xb, and a ratio of thickness Yc/Ya is not smaller than 0.2 and not greater than 3 where a thickness of the A2 layer above is denoted by Ya and a thickness of the C layer above is denoted by Yc. Moreover, preferably, the composite super multi-layer film above has a thickness not smaller than 1.0 μm and not greater than 8.0 μm.

In addition, preferably, the coating film above further includes an intermediate layer, and the intermediate layer is formed directly on the substrate above to a thickness not smaller than 0.1 μm and not greater than 1.0 μm and composed of any of TiN, TiCN, TiAlN, TiAlCN, TiSiN, TiSiCN, AlCrN, and AlCrCN.

In addition, preferably, the coating film above further includes a surface layer, and the surface layer is formed as an uppermost layer of the coating film above to a thickness not smaller than 0.1 μm and not greater than 2.0 μm. Such a surface layer is preferably formed of the second super multi-layer film above. Moreover, such a surface layer is preferably composed of any of TiN, TiCN, TiAlN, TiAlCN, TiSiN, TiSiCN, AlCrN, and AlCrCN.

Further, the coating film above is preferably formed with a physical vapor deposition method, and the substrate above is preferably formed from any of cemented carbide, cermet, high-speed steel, ceramics, sintered cubic boron nitride, and sintered diamond.

Effects of the Invention

The surface-coated cutting tool according to the present invention has the coating film less likely to suffer brittleness while maintaining heat resistance and wear resistance as a result of the above-described structure.

DESCRIPTION OF THE REFERENCE SIGNS 1, 2, 3, 4 evaporation source; 5 chamber; 6 substrate holder; 7 substrate; and 10 arc ion plating apparatus.

BEST MODES FOR CARRYING OUT THE INVENTION

The present invention will be described hereinafter in detail. In the present invention, a thickness of a coating film is measured by using a scanning electron microscope (SEM) or a transmission electron microscope (TEM) and a composition of the coating film is determined by using an energy dispersive X-ray spectrometer (EDS).

<Surface-Coated Cutting Tool>

The surface-coated cutting tool according to the present invention includes the substrate and the coating film formed on the substrate. The surface-coated cutting tool according to the present invention having such a basic structure is extremely useful as a drill, an end mill, a tip with replaceable edge for milling or turning, a metal saw, a gear cutting tool, a reamer, a tap, or a tip for crankshaft pin milling.

<Substrate>

A conventionally known material for the substrate of such a cutting tool may be used as the substrate for the surface-coated cutting tool according to the present invention, without particularly limited. Examples of such a substrate include cemented carbide (for example, WC based cemented carbides composed of WC alone or combination of WC and Co and/or carbonitride of Ti, Ta, Nb, or the like), cermet (mainly composed of TiC, TiN, TiCN, or the like), high-speed steel, ceramics (titanium carbide, silicon carbide, silicon nitride, aluminum nitride, aluminum oxide, a mixture thereof, and the like), sintered cubic boron nitride, sintered diamond, and the like. In the case of employing the cemented carbide as the substrate, the effect of the present invention is obtained even when the cemented carbide contains free carbon or an abnormal phase called η phase in its texture.

It is noted that the surface of the substrate may be reformed. For example, in the case of the cemented carbide, a β-phase-removed layer may be formed on its surface, or in the case of the cermet, a surface-hardened layer may be formed. Even if the surface is reformed in such a manner, the effect of the present invention is still obtained.

<Coating Film>

The coating film according to the present invention is characterized by including a composite super multi-layer film obtained by alternately stacking one or more first super multi-layer film and one or more second super multi-layer film. The first super multi-layer film is formed by alternately stacking one or more A1 layer and one or more B layer, the second super multi-layer film is formed by alternately stacking one or more A2 layer and one or more C layer, each of the A1 layer above and the A2 layer above is composed of any of TiN, TiCN, TiAlN, and TiAlCN, the B layer above is composed of TiSiN or TiSiCN, and the C layer above is composed of AlCrN or AlCrCN.

Thus, the A1 layer and the A2 layer above are stacked on the B layer and the C layer above excellent in heat resistance or wear resistance respectively, so that such a disadvantage as brittleness is successfully eliminated while maintaining suitable characteristics originally possessed by the B layer and the C layer, that is, excellent heat resistance or wear resistance. In addition, the first super multi-layer film including the B layer and the second super multi-layer film including the C layer are alternately stacked, so that drastic improvement in the strength of the coating film has successfully been achieved as compared with an example where each super multi-layer film is formed alone. The reason may be because, if each super multi-layer film above is formed alone, brittleness is more likely as the thickness thereof is greater, whereas each super multi-layer film can be controlled to have a small thickness by alternately stacking these super multi-layer films.

It is noted that the coating film according to the present invention also encompasses an example where the coating film covers the entire surface of the substrate, an example where the coating film is partially not formed, and an example where a manner of stack in the coating film is partially different.

In addition, the coating film according to the present invention may include a layer such as an intermediate layer or a surface layer as will be described later, other than the composite super multi-layer film above. Such a coating film has a thickness (total thickness) preferably not smaller than 1 μm and not greater than 11 μm, more preferably the upper limit thereof being not greater than 9 μm and further preferably not greater than 7 μm and the lower limit thereof being not smaller than 1.2 μm and further preferably not smaller than 1.5 μm. If the thickness is less than 1 μm, heat resistance or wear resistance may not sufficiently be exhibited. If the thickness exceeds 11 μm, the strength is lowered, which may not be preferable.

In the present invention, a constituent unit forming the coating film is referred to as a "film" or a "layer", however, this is for the sake of convenience and does not intend to clearly distinguish between the same.

<Composite Super Multi-Layer Film>

The composite super multi-layer film according to the present invention has a structure obtained by alternately stacking one or more first super multi-layer film and one or more second super multi-layer film. Such a composite super multi-layer film has a thickness preferably not smaller than 1.0 μm and not greater than 8.0 μm, more preferably the upper limit thereof being not greater than 7 μm and further preferably not greater than 6 μm and the lower limit thereof being not smaller than 1.4 μm and further preferably not smaller than 1.5 μm. If the thickness is less than 1.0 μm, heat resistance or wear resistance may not sufficiently be exhibited. If the thickness exceeds 8.0 μm, the strength is lowered, which may not be preferable.

Though the number of stacked first super multi-layer films and second super multi-layer films forming the composite super multi-layer film is not particularly limited, the number of stacked films is each preferably not smaller than 3 and not greater than 15 in terms of manufacturing efficiency. In addition, the order of stacking the first super multi-layer film and the second super multi-layer film is not particularly limited either. Namely, stacking may be started from any of the first super multi-layer film and the second super multi-layer film (that is, any of the first super multi-layer film and the second super multi-layer film may be located on the substrate side), or stacking may be ended with any of these (that is, any of the first super multi-layer film and the second super multi-layer film may also be located on the coating film surface side).

<First Super Multi-Layer Film>

The first super multi-layer film according to the present invention has a structure obtained by alternately stacking one or more A1 layer and one or more B layer. Such a first super multi-layer film has a thickness preferably not smaller than 0.1 μm and not greater than 0.5 μm, more preferably the upper limit thereof being not greater than 0.45 μm and further preferably not greater than 0.4 μm and the lower limit thereof being not smaller than 0.15 μm and further preferably not smaller than 0.2 μm. If the thickness is less than 0.1 μm, it is more likely that it is difficult to uniformly stack the A1 layer and the B layer, sufficient improvement in performance cannot be achieved, and quality is not uniform. Alternatively, if the thickness exceeds 0.5 μm, the strength is lowered and the coating film peels off, which may not be preferable.

Though the number of stacked A1 layers and B layers forming the first super multi-layer film is not particularly limited, the number of stacked layers is each preferably not smaller than 2 and not greater than 50 in terms of manufacturing efficiency. In addition, the order of stacking the A1 layer and the B layer is not particularly limited either. Namely, stacking may be started from any of the A1 layer and the B layer (that is, any of the A1 layer and the B layer may be located on the substrate side), or stacking may be ended with any of these (that is, any of the A1 layer and the B layer may also be located on the coating film surface side).

Though respective first super multi-layer films forming the composite super multi-layer film are substantially identical in properties such as a composition, a thickness or the like (a composition, a thickness or the like of the A1 layer and the B layer), difference in properties depending on manufacturing conditions does not mean departure from the scope of the present invention.

<Second Super Multi-Layer Film>

The second super multi-layer film according to the present invention has a structure obtained by alternately stacking one or more A2 layer and one or more C layer. Such a second super multi-layer film has a thickness preferably not smaller than 0.1 μm and not greater than 0.5 μm, more preferably the upper limit thereof being not greater than 0.45 μm and further preferably not greater than 0.4 μm and the lower limit thereof being not smaller than 0.15 μm and further preferably not smaller than 0.2 μm. If the thickness is less than 0.1 μm, it is more likely that it is difficult to uniformly stack the A2 layer and the C layer, sufficient improvement in performance cannot be achieved, and quality is not uniform. Alternatively, if the thickness exceeds 0.5 μm, the strength is lowered and the coating film peels off, which may not be preferable.

Though the number of stacked A2 layers and C layers forming the second super multi-layer film is not particularly limited, the number of stacked layers is each preferably not smaller than 2 and not greater than 50 in terms of manufacturing efficiency. In addition, the order of stacking the A2 layer and the C layer is not particularly limited either. Namely, stacking may be started from any of the A2 layer and the C layer (that is, any of the A2 layer and the C layer may be located on the substrate side), or stacking may be ended with any of these (that is, any of the A2 layer and the C layer may also be located on the coating film surface side).

Though respective second super multi-layer films forming the composite super multi-layer film are substantially identical in properties such as a composition, a thickness or the like (a composition, a thickness or the like of the A2 layer and the C layer), difference in properties depending on manufacturing conditions does not mean departure from the scope of the present invention.

<Thickness Ratio Between First Super Multi-Layer Film and Second Super Multi-Layer Film>

As described above, preferably, each of the first super multi-layer film above and the second super multi-layer film above has a thickness not smaller than 0.1 μm and not greater than 0.5 μm and a ratio of thickness Y/X is not smaller than 0.5 and not greater than 4 where a thickness of the first super multi-layer film is denoted by X and a thickness of the second super multi-layer film is denoted by Y. By controlling the ratio of thickness Y/X within this range, excellent characteristics as described above, that is, the characteristic that brittleness is not exhibited while maintaining heat resistance and wear resistance, can sufficiently be achieved. The thickness ratio Y/X is more preferably not smaller than 0.8 and not greater than 3.5 and further preferably not smaller than 1 and not greater than 3.

If ratio of thickness Y/X above is less than 0.5, the strength of the coating film may be lowered, which is not preferable. Alternatively, if ratio of thickness Y/X above exceeds 4, wear resistance may be lowered, which is not preferable.

It is noted that ratio of thickness Y/X represents a ratio of thickness between any of the first super multi-layer films and any of the second super multi-layer films that form the composite super multi-layer film and a location where this ratio is to be found is not particularly limited, however, a ratio of thickness between adjacent films is preferably determined.

<A1 Layer and A2 Layer>

In the present invention, each of the A1 layer forming the first super multi-layer film and the A2 layer forming the second super multi-layer film is composed of any of TiN, TiCN, TiAlN, and TiAlCN. The A1 layer and the A2 layer have such a chemical composition, so that brittleness exhibited by the B layer and the C layer which will be described later can extremely effectively be lowered. Namely, by alternately stacking the A1 layer and the A2 layer on the B layer and the C layer respectively, an excellent effect that brittleness is not exhibited while maintaining heat resistance and wear resistance as described above can be obtained.

Here, though the A1 layer and the A2 layer may be different in composition, preferably these layers are suitably identical in composition. This is because, when the A1 layer and the A2 layer are identical in composition, contact between the first super multi-layer film and the second super multi-layer film can particularly be improved.

It is noted that chemical formulae used in the present invention do not particularly define an atomic ratio of elements and do not intend an equal atomic ratio of elements. Namely, it is assumed that the chemical formulae used in the present invention include all atomic ratios that have conventionally been known (if an equal ratio is known, that equal ratio is included). For example, a chemical formula TiN does not indicate an atomic ratio between Ti and N of 1:1 but it encompasses all conventionally known atomic ratios such as 2:1, 1:1, 1:0.95, 1:0.9, and the like (this is also the case with chemical formulae other than TiN unless otherwise specified).

In addition, each of the A1 layer and the A2 layer preferably has a thickness not greater than 40 nm, more preferably not greater than 35 nm, and further preferably not greater than 30 nm. By thus controlling the thickness, an effect to improve brittleness by the A1 layer and the A2 layer can satisfactorily be exhibited. Though the lower limit of the thickness is not particularly limited, if the thickness is less than 0.5 nm, it may be difficult to uniformly stack these layers and to sufficiently exhibit brittleness improvement performance. On the other hand, if the thickness exceeds 40 nm, an effect to improve heat resistance or wear resistance by the B layer or the C layer may be lowered.

<B Layer>

In the present invention, the B layer forming the first super multi-layer film is composed of TiSiN or TiSiCN. As the B layer has such a chemical composition, heat resistance and wear resistance of the coating film can be improved.

Here, the B layer preferably has a thickness not greater than 40 nm, more preferably not greater than 30 nm, and further preferably not greater than 25 nm. By thus controlling the thickness, an effect as described above can satisfactorily be exhibited. Though the lower limit of the thickness is not particularly limited, if the thickness is less than 0.5 nm, it may be difficult to uniformly stack the B layer and to sufficiently exhibit the effect as above. On the other hand, if the thickness exceeds 40 nm, it may be difficult to lower brittleness.

<C Layer>

In the present invention, the C layer forming the second super multi-layer film is composed of AlCrN or AlCrCN. As the C layer has such a chemical composition, heat resistance and wear resistance of the coating film can be improved and lubricating property can be improved.

Here, the C layer preferably has a thickness not greater than 40 nm, more preferably not greater than 35 nm, and further preferably not greater than 30 nm. By thus controlling the thickness, an effect as described above can satisfactorily be exhibited. Though the lower limit of the thickness is not particularly limited, if the thickness is less than 0.5 nm, it may be difficult to uniformly stack the C layer and to sufficiently exhibit the effect as above. On the other hand, if the thickness exceeds 40 nm, it may be difficult to lower brittleness.

<Thickness Ratio Between A1 Layer, A2 Layer, B Layer, and C Layer>

As described above, preferably, each of the A1 layer, the A2 layer, the B layer, and the C layer above has a thickness not greater than 40 nm, a ratio of thickness Xb/Xa is not smaller than 0.2 and not greater than 3 where a thickness of the A1 layer above is denoted by Xa and a thickness of the B layer above is denoted by Xb, and a ratio of thickness Yc/Ya is not smaller than 0.2 and not greater than 3 where a thickness of the A2 layer above is denoted by Ya and a thickness of the C layer above is denoted by Yc. By controlling each of the ratios of thickness Xa/Xb and Yc/Ya within the range described above, excellent characteristics as described above, that is, the characteristic that brittleness is not exhibited while maintaining heat resistance and wear resistance, can be achieved. The ratios of thickness Xb/Xa and Yc/Ya are more preferably not smaller than 0.3 and not greater than 2.5 and further preferably not smaller than 0.4 and not greater than 2.

If the ratios of thickness Xb/Xa and Yc/Ya above are less than 0.2, heat resistance and wear resistance may be lowered, which is not preferable. On the other hand, if the ratios of thickness Xb/Xa and Yc/Ya above exceed 3, brittleness may be exhibited (embrittlement), which is not preferable.

It is noted that ratio of thickness Xb/Xa above represents a ratio of thickness between any of the A1 layers and any of the B layers that form each first super multi-layer film and a location where this ratio is to be found is not particularly limited, however, a ratio of thickness between two adjacent layers is preferably determined. In addition, ratio of thickness Yc/Ya above represents a ratio of thickness between any of the A2 layers and any of the C layers that form each second super multi-layer film and a location where this ratio is to be found is not particularly limited, however, a ratio of thickness between two adjacent layers is preferably determined.

<Intermediate Layer>

The coating film according to the present invention may further include an intermediate layer other than the composite super multi-layer film above. Preferably, the intermediate layer is formed directly on the substrate above to a thickness not smaller than 0.1 µm and not greater than 1.0 µm and composed of any of TiN, TiCN, TiAlN, TiAlCN, TiSiN, TiSiCN, AlCrN, and AlCrCN. The thickness above is more preferably not smaller than 0.2 µm and not greater than 0.5 µm.

By forming such an intermediate layer directly on the substrate (that is, forming the intermediate layer between the substrate and the composite super multi-layer film), contact between the substrate and the composite super multi-layer film can be improved. If the thickness above is less than 0.1 µm, the effect of improvement in contact above may not sufficiently be exhibited. On the other hand, if the thickness exceeds 1.0 µm, contact may be lowered.

<Surface Layer>

The coating film according to the present invention may further include a surface layer other than the composite super multi-layer film above. The surface layer is formed as an uppermost layer of the coating film above to a thickness not smaller than 0.1 µm and not greater than 2.0 µm. Such a surface layer may be formed of the second super multi-layer film above. Moreover, such a surface layer may be composed of any of TiN, TiCN, TiAlN, TiAlCN, TiSiN, TiSiCN, AlCrN, and AlCrCN. The thickness above is more preferably not smaller than 0.3 µm and not greater than 1.5 µm. If the surface layer is formed of the second super multi-layer film, the thickness above is preferably not smaller than 0.6 µm and not greater than 1.5 µm.

By forming such a surface layer as the uppermost layer (preferably, forming the surface layer on the composite super multi-layer film), lubricating property of the coating film can be improved. In addition, particularly when the surface layer is formed of the second super multi-layer film, chipping involved with a work material of low hardness, with which adhesion at a cutting edge is likely, such as SS400 (rolled steel) or SCM415 (alloy steel), can be suppressed. If the thickness above is less than 0.1 µm, the effect of improvement in lubricating property above may not sufficiently be exhibited. On the other hand, if the thickness exceeds 2.0 µm, the strength of the coating film may be lowered.

It is noted that the coating film according to the present invention may include both of such a surface layer and the intermediate layer above other than the composite super multi-layer film, or may include only any one of them.

<Manufacturing Method>

In order to form (deposit) the coating film of the present invention on the surface of the substrate, a film deposition process capable of forming a highly crystalline compound is preferably employed. As a result of review of various film deposition methods, the coating film according to the present invention is optimally formed with a physical vapor deposition method. Namely, the coating film according to the present invention is preferably formed with the physical vapor deposition method.

A sputtering method, an ion plating method and the like have been known as such a physical vapor deposition method, and any conventionally known physical vapor deposition method may be adopted. In particular, an arc ion plating method high in a rate of ionization of a raw material element is particularly preferably adopted. By adopting the arc ion plating method, the surface of the substrate can be subjected to metal or gas ion bombardment treatment prior to formation of the coating film, so that contact of the coating film can drastically be improved. In this regard as well, the arc ion plating method is a preferred film deposition process in the present invention.

A specific method for forming the composite super multi-layer film with the arc ion plating method will be illustrated hereinafter with reference to FIG. 1. It is noted that the intermediate layer or the surface layer above can also be formed with the arc ion plating method by adopting conventionally known conditions.

Figure 1:
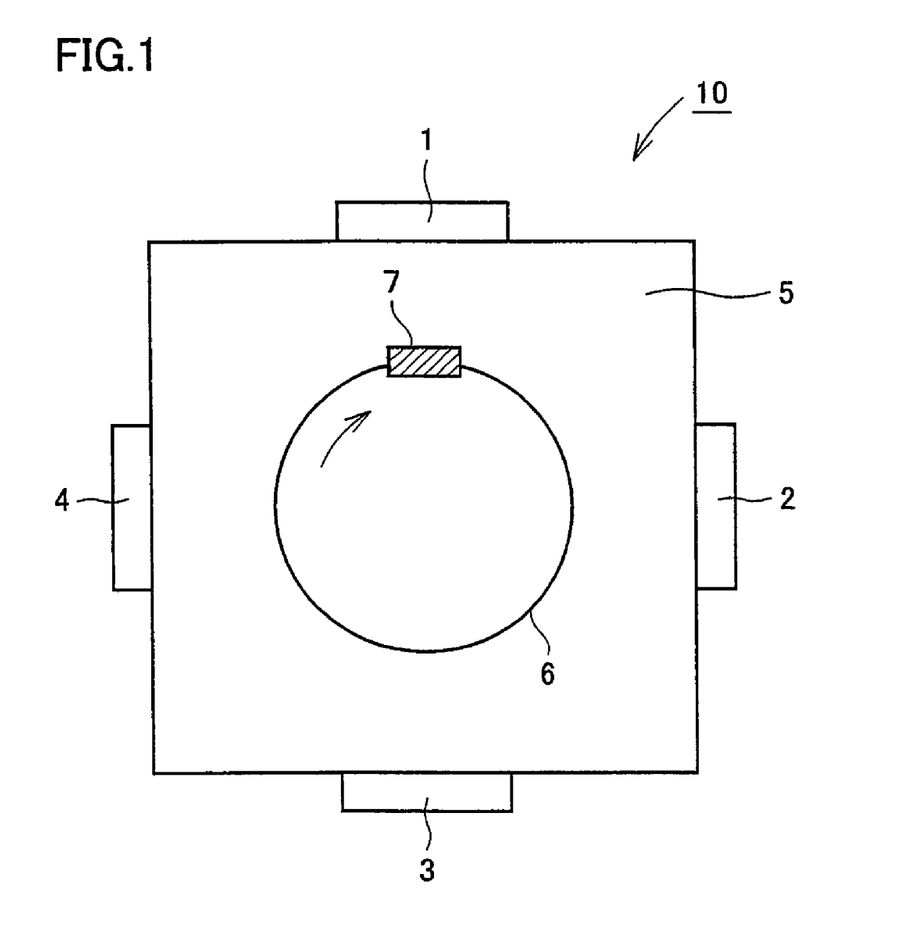
FIG. 1 is a schematic diagram of an arc ion plating apparatus.

FIG. 1 is a schematic diagram of an arc ion plating apparatus 10 with which the arc ion plating method is performed (schematic plan view, viewed from above). Initially, target materials are set at evaporation sources 1 to 4. For example, a target material for forming the A1 layer (that is, Ti or TiAl) is set at evaporation source 1, a target material for forming the B layer (that is, TiSi) is set at evaporation source 2, a target material for forming the A2 layer (that is, Ti or TiAl) is set at evaporation source 3, and a target material for forming the C layer (that is, AlCr) is set at evaporation source 4. Then, a substrate 7 is set at a substrate holder 6 within a chamber 5, and the first super multi-layer film is formed with evaporation sources 1 and 2 and the second super multi-layer film is formed with evaporation sources 3 and 4 while substrate holder 6 is turned.

Specifically, substrate holder 6 is turned once or a plurality of times while the target materials on evaporation sources 1 and 2 are evaporated and ionized, so that the first super multi-layer film is formed on the substrate. Then, substrate holder 6 is turned once or a plurality of times while the target materials on evaporation sources 3 and 4 are evaporated and ionized, so that the second super multi-layer film is formed on the first super multi-layer film. Thus, the composite super multi-layer film obtained by stacking one first super multi-layer film and one second super multi-layer film, corresponding to the smallest number of stacks in the composite super multi-layer film of the present invention, is formed. By repeating the operation above hereafter, the composite super multi-layer film obtained by alternately stacking one or more first super multi-layer film and one or more second super multi-layer film can be formed. More specific conditions are exemplified below.

Initially, substrate 7 is heated to 200 to 500° C. by using a heater (not shown) provided in chamber 5. Thereafter, while an argon gas is introduced to maintain a pressure within chamber 5 at 1 to 3 Pa, a bias voltage (−300 to −600V) is applied to the substrate, to thereby subject the surface of the substrate to cleaning treatment with argon ions for 30 to 60 minutes.

Successively, after the argon gas within chamber 5 is exhausted, a nitrogen gas or a gas mixture of the nitrogen gas and a carbon source gas such as methane is introduced as a reaction gas to maintain the pressure within chamber 5 at 2 to 5 Pa. By applying a bias voltage (−20 to −100V) to the substrate while substrate holder 6 at which substrate 7 has been set is turned, the target material set at evaporation source 1 and the target material set at evaporation source 2 are evaporated and ionized by arc discharge (arc current 100 to 150 A), to thereby form the first super multi-layer film on the substrate.

Thereafter, while turning of substrate holder 6, the pressure in chamber 5, and the bias voltage applied to the substrate are maintained, the target material set at evaporation source 3 and the target material set at evaporation source 4 are evaporated and ionized under the conditions the same as above, to thereby form the second super multi-layer film on the first super multi-layer film.

Thereafter, by alternately repeating the operation to form the first super multi-layer film and the operation to form the second super multi-layer film as above a plurality of times, the composite super multi-layer film can be formed. It is noted that any composition, any thickness, and any number of stacks of each layer can be set by controlling a type of a reaction gas, a film deposition time period, a rate of ionization of the target material, a speed of turning the substrate holder, and the like.

Example

In the following, the present invention will be described in detail with reference to examples, however, the present invention is not limited thereto.

<Formation of Coating Film>

A case where the coating film according to Example 1 shown in Table 1 is formed with the arc ion plating method by using arc ion plating apparatus 10 as shown in FIG. 1 is exemplified. As different substrates are used for three respective types of cutting tests which will be described later, the coating film was formed under the same conditions for these three types of substrates.

Initially, Ti was set at evaporation source 1 as the target material for forming the A1 layer, a TiSi alloy (atomic ratio Ti:Si=80:20) was set at evaporation source 2 as the target material for forming the B layer, Ti was set at evaporation source 3 as the target material for forming the A2 layer, and an AlCr alloy (atomic ratio Al:Cr=70:30) was set at evaporation source 4 as the target material for forming the C layer.

Then, substrate 7 set at substrate holder 6 was heated to 500° C. by using the heater provided in chamber 5. Thereafter, while the argon gas was introduced to maintain the pressure within chamber 5 at 3.0 Pa, a bias voltage (−300V) was applied to the substrate, to thereby subject the surface of the substrate to cleaning treatment with argon ions for 30 minutes.

Successively, after the argon gas within chamber 5 was exhausted, the nitrogen gas was introduced to maintain the pressure within chamber 5 at 5.0 Pa. By applying a bias voltage (−50V) to the substrate while substrate holder 6 above was turned, the target material set at evaporation source 1 and the target material set at evaporation source 2 were evaporated and ionized by arc discharge (arc currents were set to 150 A and 100 A respectively), to thereby form the first super multi-layer film on the substrate to a thickness of 0.3 μm. Here, as the thickness of the A1 layer and the thickness of the B layer were controlled to 100 nm and 50 nm respectively, A1 layer and B layer were alternately stacked twice in this order, to form the first super multi-layer film (thickness ratio Xb/Xa was 0.5). It is noted that the atomic ratio of TiN forming the A1 layer was Ti:N=1:1, and the atomic ratio of TiSiN forming the B layer was Ti:Si:N=4:1:5.

Thereafter, while turning of substrate holder 6, the pressure in chamber 5, and the bias voltage applied to the substrate were maintained (here, the nitrogen gas and the methane gas were used as the reaction gas), the target material set at evaporation source 3 and the target material set at evaporation source 4 were evaporated and ionized by arc discharge (arc currents were both set to 100 A), to thereby form the second super multi-layer film on the first super multi-layer film formed as above to a thickness of 1.5 μm. Here, as the thickness of the A2 layer and the thickness of the C layer were controlled to 50 nm and 25 nm respectively, A2 layer and C layer were alternately stacked 20 times in this order, to form the second super multi-layer film (thickness ratio Yc/Ya was 0.5). It is noted that the atomic ratio of TiCN forming the A2 layer was Ti:C:N=2:1:1, and the atomic ratio of AlCrCN forming the C layer was Ar:Cr:C:N=7:3:5:5.

Thereafter, by alternately repeating the operation to form the first super multi-layer film and the operation to form the second super multi-layer film as above four times, the composite super multi-layer film having a thickness of 9 μm obtained by alternately stacking first super multi-layer film and second super multi-layer film five times was formed.

By performing the operation similar to the above, the coating films according to Examples 1 to 18 shown in Table 1 were formed. As described above, in these coating films, a composition (an atomic ratio is not limited but any conventionally known atomic ratio may be adopted), a thickness, and the number of stacks of each layer are controlled by controlling a type of a reaction gas, a film deposition time period, a rate of ionization of the target material, a speed of turning the substrate holder, and the like.

For example, the coating film according to Example 5 can be formed in a manner the same as that for the coating film according to Example 1, by setting Ti at evaporation source 1 as the target material for forming the A1 layer, setting the TiSi alloy at evaporation source 2 as the target material for forming the B layer, setting the TiAl alloy at evaporation source 3 as the target material for forming the A2 layer, setting the AlCr alloy at evaporation source 4 as the target material for forming the C layer, employing the gas mixture of the nitrogen gas and the methane gas as the reaction gas for forming the first super multi-layer film, and employing the nitrogen gas as the reaction gas for forming the second super multi-layer film.

In addition, with regard to a coating film including an intermediate layer or a surface layer as in the coating film according to Examples 8, 11, 17, and 18, a layer other than the composite super multi-layer film can be formed by using each target material for forming the super multi-layer film having corresponding composition, without modification.

For the purpose of comparison, coating films according to Comparative Examples 1 to 7 shown in Table 2 were also formed by adopting the conditions the same as above. Specifically, Comparative Examples 1 to 3 correspond to Examples 1, 13 and 16, respectively, and they are different from the examples in composition or combination of the A1 layer, the A2 layer, the B layer, and the C layer. Comparative Example 4 corresponds to Example 14, in which the B layer alone forms the first super multi-layer film and the C layer alone forms the second super multi-layer film. Comparative Example 5 corresponds to Example 15, in which only a simple super multi-layer film obtained by alternately stacking the B layer and the C layer is included as the coating film. Comparative Example 6 corresponds to Example 8, in which only the first super multi-layer film is included as the coating film. Comparative Example 7 corresponds to Example 17, in which only the second super multi-layer film is included as the coating film.

TABLE 1

| | | First Super Multi-Layer Film | | | | | Second Super Multi-Layer Film | | | |
| | | A1 Layer | | B Layer | | Thickness | A2 Layer | | C Layer | |
| | No. | Composition | Thickness (nm) | Composition | Thickness (nm) | Ratio Xb/Xa | Thickness (μm) | Composition | Thickness (nm) | Composition | Thickness (nm) |
|---|---|---|---|---|---|---|---|---|---|---|---|
| Example | 1 | TiN | 100 | TiSiN | 50 | 0.5 | 0.3 | TiCN | 50 | AlCrCN | 25 |
| | 2 | TiN | 100 | TiSiN | 50 | 0.5 | 0.15 | TiCN | 50 | AlCrCN | 25 |
| | 3 | TiN | 5 | TiSiN | 2 | 0.4 | 0.21 | TiCN | 5 | AlCrCN | 9 |
| | 4 | TiCN | 10 | TiSiCN | 50 | 5.0 | 0.18 | TiAlN | 40 | AlCrN | 5 |
| | 5 | TiCN | 20 | TiSiCN | 40 | 2.0 | 0.18 | TiAlN | 10 | AlCrN | 5 |
| | 6 | TiAlN | 55 | TiSiN | 5 | 0.09 | 0.84 | TiAlCN | 10 | AlCrCN | 35 |
| | 7 | TiAlN | 55 | TiSiN | 5 | 0.09 | 0.48 | TiAlCN | 10 | AlCrCN | 35 |
| | 8 | TiAlN | 10 | TiSiN | 5 | 0.5 | 0.24 | TiAlCN | 10 | AlCrCN | 20 |
| | 9 | TiAlCN | 45 | TiSiCN | 5 | 0.11 | 0.1 | TiCN | 60 | AlCrCN | 10 |
| | 10 | TiAlCN | 25 | TiSiCN | 5 | 0.2 | 0.12 | TiCN | 40 | AlCrCN | 10 |
| | 11 | TiCN | 5 | TiSiCN | 5 | 1.0 | 0.2 | TiCN | 15 | AlCrCN | 25 |
| | 12 | TiN | 30 | TiSiN | 120 | 4.0 | 0.6 | TiAlN | 20 | AlCrN | 80 |
| | 13 | TiN | 30 | TiSiN | 120 | 4.0 | 0.6 | TiN | 20 | AlCrN | 80 |
| | 14 | TiN | 30 | TiSiN | 120 | 4.0 | 0.45 | TiN | 20 | AlCrN | 80 |
| | 15 | TiN | 10 | TiSiN | 30 | 3.0 | 0.4 | TiN | 5 | AlCrN | 15 |
| | 16 | TiN | 10 | TiSiN | 20 | 2.0 | 0.3 | TiN | 20 | AlCrN | 10 |
| | 17 | TiN | 30 | TiSiN | 20 | 0.67 | 0.2 | TiN | 15 | AlCrN | 15 |
| | 18 | TiN | 30 | TiSiN | 20 | 0.67 | 0.2 | TiN | 15 | AlCrN | 15 |

| | | Second Super Multi-Layer Film | | | The Number of Stacks | Intermediate Layer | | Surface Layer | | Total |
| | No. | Ratio Yc/Ya | Thickness (μm) | Ratio Y/X | | Composition | Thickness (μm) | Composition | Thickness (μm) | Thickness (μm) |
|---|---|---|---|---|---|---|---|---|---|---|
| Example | 1 | 0.5 | 1.5 | 5.0 | 5 | — | — | — | — | 9 |
| | 2 | 0.5 | 0.45 | 3.0 | 15 | — | — | — | — | 9 |
| | 3 | 1.8 | 0.35 | 1.67 | 14 | — | — | — | — | 7.84 |
| | 4 | 0.125 | 0.27 | 1.5 | 8 | — | — | — | — | 3.6 |
| | 5 | 0.5 | 0.3 | 1.67 | 8 | — | — | — | — | 3.84 |
| | 6 | 3.5 | 0.09 | 0.11 | 1 | — | — | — | — | 0.93 |
| | 7 | 3.5 | 0.27 | 0.56 | 3 | — | — | — | — | 2.25 |
| | 8 | 2.0 | 0.27 | 1.13 | 3 | TiSiCN | 0.5 | — | — | 2.03 |
| | 9 | 0.167 | 0.49 | 4.9 | 10 | — | — | — | — | 5.9 |

TABLE 1-continued

| | | | | | | | | | | |
|---|---|---|---|---|---|---|---|---|---|---|
| 10 | 0.25 | 0.45 | 3.75 | 10 | — | — | — | — | 5.7 |
| 11 | 1.67 | 0.4 | 2.0 | 9 | — | — | AlCrN | 0.5 | 5.9 |
| 12 | 4.0 | 0.2 | 0.33 | 12 | — | — | — | — | 9.6 |
| 13 | 4.0 | 0.2 | 0.33 | 12 | — | — | — | — | 9.6 |
| 14 | 4.0 | 0.3 | 0.67 | 10 | — | — | — | — | 7.5 |
| 15 | 3.0 | 0.5 | 1.25 | 5 | — | — | — | — | 4.5 |
| 16 | 0.5 | 0.3 | 1.0 | 8 | — | — | — | — | 4.8 |
| 17 | 1.0 | 0.36 | 1.8 | 8 | TiN | 0.2 | TiSiCN | 1 | 5.68 |
| 18 | 1.0 | 0.36 | 1.8 | 8 | TiN | 0.2 | Note 1 | 1 | 5.68 |

Note 1) The same as the composition (structure) of the second super multi-layer film in present Example 18

TABLE 2

| | | First Super Multi-Layer Film | | | | | Second Super Multi-Layer Film | | | |
|---|---|---|---|---|---|---|---|---|---|---|
| | | A1 Layer | | B Layer | | Thickness | A2 Layer | | | |
| | | | Thickness | | Thickness | Ratio | Thickness | | Thickness | C Layer |
| No. | | Composition | (nm) | Composition | (nm) | Xb/Xa | (μm) | Composition | (nm) | Composition | Thickness (nm) |
| Comparative Example | 1 | TiSiN | 100 | TiN | 50 | 0.5 | 0.3 | TiSiN | 50 | AlCrN | 25 |
| | 2 | TiN | 30 | TiSiN | 120 | 4.0 | 0.6 | TiN | 20 | TiAlN | 80 |
| | 3 | ZrCN | 10 | TiSiCN | 20 | 2.0 | 0.3 | ZrN | 20 | AlCrN | 10 |
| | 4 | — | — | TiSiN | — | — | 0.45 | — | — | AlCrN | — |
| | 5 | TiSiN | 30 | AlCrN | 15 | 0.5 | 4.5 | — | — | — | — |
| | 6 | TiAlN | 10 | TiSiN | 5 | 0.5 | 1.5 | — | — | — | — |
| | 7 | — | — | — | — | — | — | TiN | 15 | AlCrN | 15 |

| | | Second Super Multi-Layer Film | | | The Number of Stacks | Intermediate Layer | | Surface Layer | | Total |
|---|---|---|---|---|---|---|---|---|---|---|
| | | Thickness Ratio Yc/Ya | Thickness (μm) | Thickness Ratio Y/X | | Composition | Thickness (μm) | Composition | Thickness (μm) | Thickness (μm) |
| No. | | | | | | | | | | |
| Comparative Example | 1 | 0.5 | 1.5 | 5.0 | 5 | — | — | — | — | 9 |
| | 2 | 4.0 | 0.2 | 0.33 | 12 | — | — | — | — | 9.6 |
| | 3 | 0.5 | 0.3 | 1.0 | 8 | — | — | — | — | 4.8 |
| | 4 | — | 0.3 | 0.67 | 10 | — | — | — | — | 7.5 |
| | 5 | — | — | — | — | — | — | — | — | 4.5 |
| | 6 | — | — | — | — | TiSiCN | 0.5 | — | — | 2.0 |
| | 7 | 1.0 | 4.5 | — | — | TiN | 0.2 | TiSiCN | 1 | 5.7 |

In Tables 1 and 2, the number of stacks represents the number of stacks in each of the first super multi-layer film and the second super multi-layer film and the total thickness represents the total thickness of the entire coating film. In addition, a blank field indicates that no such coating is formed. Therefore, in the example where the intermediate layer and the surface layer are not formed, it is indicated that only the composite super multi-layer film obtained by alternately stacking the first super multi-layer film and the second super multi-layer film is formed as the coating film on the substrate. In the example where the intermediate layer is formed, the intermediate layer is formed between the substrate and the composite super multi-layer film, and the surface layer is formed on the composite super multi-layer film.

The coating films in these Examples 1 to 18 and Comparative Examples 1 to 7 were subjected to the following three types of cutting tests. The results of the tests are as shown in Table 3.

<End Mill Cutting Test>

A square end mill made of cemented carbide (diameter (outer diameter) 8 mm, 4 blades) was employed as the substrate. SKD11 (HRC53) was employed as the work material, and the shoulder milling was performed at a cutting speed of 120 m/min, a feed rate of 0.03 mm/tooth, a depth of cut Ad of 8 mm, and Rd of 0.4 mm, with air blow.

Evaluation of cutting performance (test results) is shown as a distance of cut (m) at a time point when a wear width of an outer periphery of a cutting edge exceeds 0.1 mm. A longer distance indicates superior cutting performance (longer life of a tool, that is, excellent heat resistance and wear resistance and lower brittleness), and a shorter distance or chipping at an early stage of cutting (denoted as "chipping at early stage") indicates poor cutting performance.

<Drill Cutting Test>

A drill made of cemented carbide (diameter (outer diameter) 10 mm) was employed as the substrate. S50C (HB220) was employed as the work material, and wet type drilling (through hole of 30 mm depth) was performed at a cutting speed of 80 m/min and a feed rate of 0.2 mm/rev. with coolant.

Evaluation of cutting performance (test results) is shown as a distance of cut (unit m, the number of drilled holes×30 mm) at a time point when a wear width of an outer peripheral portion at a tip end of a cutting edge exceeds 0.2 mm. A longer distance indicates superior cutting performance (longer life of a tool, that is, excellent heat resistance and wear resistance and lower brittleness), and a shorter distance or chipping at an early stage of cutting (denoted as "chipping at early stage") indicates poor cutting performance.

<Milling Insert Cutting Test>

An indexable insert for milling, that is made of cemented carbide and comparable to JIS grade P30 (shape: SPG432), was employed as the substrate. SCM435 was employed as the work material, and a cutting speed was set to 250 m/min, a feed rate was set to 0.25 mm/tooth, a depth of cut was set to 2 mm, and cutting oil was not used (dry machining).

Evaluation of cutting performance (test results) is shown as a distance of cut (m) at a time point when a flank wear width exceeds 0.2 mm. A longer distance indicates superior cutting performance (longer life of a tool, that is, excellent heat resistance and wear resistance and lower brittleness), and a shorter distance or chipping at an early stage of cutting (denoted as "chipping at early stage") indicates poor cutting performance.

TABLE 3

| | | Cutting Test (m) | | |
|---|---|---|---|---|
| No. | | End Mill | Drill | Milling Insert |
| Example | 1 | 40 | 42 | 11.1 |
| | 2 | 46 | 52 | 11.9 |
| | 3 | 62 | 75 | 15.3 |
| | 4 | 55 | 54 | 12.9 |
| | 5 | 61 | 59 | 13.7 |
| | 6 | 45 | 37 | 10.4 |
| | 7 | 54 | 46 | 12.3 |
| | 8 | 78 | 63 | 15.1 |
| | 9 | 37 | 45 | 10.9 |
| | 10 | 52 | 62 | 12.8 |
| | 11 | 70 | 79 | 15.9 |
| | 12 | 39 | 40 | 10.8 |
| | 13 | 48 | 46 | 12.6 |
| | 14 | 53 | 51 | 13 |
| | 15 | 65 | 63 | 14.1 |
| | 16 | 71 | 72 | 15.7 |
| | 17 | 80 | 77 | 16.2 |
| | 18 | 82 | 79 | 16.5 |
| Comparative Example | 1 | chipping at early stage | 11 | chipping at early stage |
| | 2 | 17 | 19 | 5.6 |
| | 3 | chipping at early stage | chipping at early stage | 3.1 |
| | 4 | chipping at early stage | chipping at early stage | chipping at early stage |
| | 5 | 18 | 10 | chipping at early stage |
| | 6 | 28 | 23 | 7.4 |
| | 7 | 25 | 21 | 7.1 |

<Additional Drill Cutting Test for Example 17, Example 18 and Comparative Example 7

A drill made of cemented carbide (diameter (outer diameter) 10 mm) the same as above was employed as the substrate, and the coating films according to Examples 17 and 18 and Comparative Example 7 were employed. SCM415 (HB=235) was employed as the work material, and wet type drilling (through hole of a hole depth of 40 mm) was performed at a cutting speed of 80 m/min and a feed rate of 0.25 min/rev. with coolant.

As a result, in Comparative Example 7, breakage occurred at a cutting length of 10 m. In contrast, in Example 17, the cutting process could be performed without breakage until a cutting length of 55 m. In addition, in Example 18, the cutting process could be performed without breakage until a cutting length of 100 m.

In Comparative Example 7 where breakage occurred, the work material adhered to the outer cutting edge, which seems to be the cause of breakage. In contrast, in Example 18, as the second super multi-layer film is formed as the surface layer, adhesion of the work material at the cutting edge hardly occurred even after cutting by a distance of 100 m. It was thus confirmed that Example 18 is superior in terms of lubricating property of the coating film.

As can clearly be seen from the results shown in Table 3 and in the additional drill cutting test above, it is clear that the surface-coated cutting tool (that is, coating film) according to the examples of the present invention has a tool life significantly longer than the surface-coated cutting tool (that is, coating film) according to the comparative examples, namely, it is excellent in heat resistance and wear resistance and achieves lower brittleness.

In other words, it was confirmed that, in the surface-coated cutting tool, the composite super multi-layer film obtained by alternately stacking one or more first super multi-layer film and one or more second super multi-layer film is included as the coating film formed on the substrate, the first super multi-layer film above is formed by alternately stacking one or more A1 layer and one or more B layer, the second super multi-layer film above is formed by alternately stacking one or more A2 layer and one or more C layer, each of the A1 layer above and the A2 layer above is composed of any of TiN, TiCN, TiAlN, and TiAlCN, the B layer above is composed of TiSiN or TiSiCN, and the C layer above is composed of AlCrN or AlCrCN, so that excellent cutting performance was exhibited. In addition, it was also confirmed that, when the surface layer of the coating film above is formed of the second super multi-layer film, adhesion of the work material to the cutting edge can be prevented, which is superior in terms of lubricating property of the coating film.

Though the embodiments and examples of the present invention have been described above, combination of embodiments and examples described above as appropriate is originally intended.

It should be understood that the embodiments and examples disclosed herein are illustrative and non-restrictive in every respect. The scope of the present invention is defined by the terms of the claims, rather than the description above, and is intended to include any modifications within the scope and meaning equivalent to the terms of the claims.

The invention claimed is:

1. A surface-coated cutting tool, comprising:
   a substrate; and
   a coating film formed on the substrate;
   said coating film including a composite super multi-layer film obtained by alternately stacking one or more first super multi-layer film and one or more second super multi-layer film,
   said first super multi-layer film being formed by alternately, one by one, stacking two or more A1 layers and two or more B layers,
   said second super multi-layer film being formed by alternately, one by one, stacking two or more A2 layers and two or more C layers,
   each of said A1 layer and said A2 layer being composed of any of TiN, TiCN, TiAlN, and TiAlCN,
   said B layer being composed of TiSiN or TiSiCN, and
   said C layer being composed of AlCrN or AlCrCN.

2. The surface-coated cutting tool according to claim 1, wherein
   said A1 layer and said A2 layer are identical in composition.

3. The surface-coated cutting tool according to claim 1, wherein
   each of said first super multi-layer film and said second super multi-layer film has a thickness not smaller than 0.1 μm and not greater than 0.5 μm, and a ratio of thickness Y/X is not smaller than 0.5 and not greater than 4 where a thickness of said first super multi-layer film is denoted by X and a thickness of said second super multi-layer film is denoted by Y.

4. The surface-coated cutting tool according to claim 1, wherein
each of said A1 layer, said A2 layer, said B layer, and said C layer has a thickness not greater than 40 nm, a ratio of thickness Xb/Xa is not smaller than 0.2 and not greater than 3 where a thickness of said A1 layer is denoted by Xa and a thickness of said B layer is denoted by Xb, and a ratio of thickness Yc/Ya is not smaller than 0.2 and not greater than 3 where a thickness of said A2 layer is denoted by Ya and a thickness of said C layer is denoted by Yc.

5. The surface-coated cutting tool according to claim 1, wherein
said composite super multi-layer film has a thickness not smaller than 1.0 μm and not greater than 8.0 μm.

6. The surface-coated cutting tool according to claim 1, wherein
said coating film further includes an intermediate layer, and
said intermediate layer is formed directly on said substrate to a thickness not smaller than 0.1 μm and not greater than 1.0 μm and composed of any of TiN, TiCN, TiAlN, TiAlCN, TiSiN, TiSiCN, AlCrN, and AlCrCN.

7. The surface-coated cutting tool according to claim 1, wherein
said coating film further includes a surface layer, and
said surface layer is formed as an uppermost layer of said coating film to a thickness not smaller than 0.1 μm and not greater than 2.0 μm.

8. The surface-coated cutting tool according to claim 7, wherein
said surface layer is formed of said second super multi-layer film.

9. The surface-coated cutting tool according to claim 7, wherein
said surface layer is composed of any of TiN, TiCN, TiAlN, TiAlCN, TiSiN, TiSiCN, AlCrN, and AlCrCN.

10. The surface-coated cutting tool according to claim 1, wherein
said coating film is formed with a physical vapor deposition method.

11. The surface-coated cutting tool according to claim 1, wherein
said substrate is formed from any of cemented carbide, cermet, high-speed steel, ceramics, sintered cubic boron nitride, and sintered diamond.

* * * * *